United States Patent [19]
Hatwar et al.

[11] Patent Number: 5,750,274
[45] Date of Patent: May 12, 1998

[54] MULTILAYER MAGNETOOPTIC RECORDING MEDIA

[75] Inventors: Tukaram K. Hatwar, Penfield; Yuan-Sheng Tyan, Webster; Charles F. Brucker, Fairport, all of N.Y.

[73] Assignee: Eastman Kodak Company, Rochester, N.Y.

[21] Appl. No.: 674,226

[22] Filed: Jun. 28, 1996

[51] Int. Cl.[6] .................................. G11B 5/66; B32B 5/16
[52] U.S. Cl. ..................... 428/694 MM; 428/694 TS; 428/668; 428/670; 428/900
[58] Field of Search ............................ 428/694 MM, 428/694 TS, 670, 668, 900

[56] References Cited

U.S. PATENT DOCUMENTS

| | | | |
|---|---|---|---|
| 5,082,749 | 1/1992 | Carcia | 428/694 |
| 5,192,626 | 3/1993 | Sekiya et al. | 428/694 |
| 5,407,755 | 4/1995 | Brucker et al. | 428/635 |
| 5,436,072 | 7/1995 | Hatwar et al. | 428/694 MM |
| 5,563,000 | 10/1996 | Hatwar et al. | 428/694 MM |
| 5,565,266 | 10/1996 | Hatwar et al. | 428/332 |

FOREIGN PATENT DOCUMENTS 0304873  8/1988  European Pat. Off. .
0304927  8/1988  European Pat. Off. .

OTHER PUBLICATIONS

J. P Abst 40-3080-421-A.

"Dielectric Enhancement Layers for a Co/Pt Multilayer Magnetooptic Recording Medium", Carcia et al, Appl. Phys Lett. 58 (1991), pp. 191-193.

S. Sumi et al, ( (Abstract Mq-3, "Magnetooptic Recording International Symposium", (MORIS), Dec., 1992, Tuscon, Arizona)).

RF Sputtered Transparent Conductors The System $In_2O_3$—$SnO_2$ by John L. Vossen, RCA Review, vol. 32, Jun. 1971.

*Primary Examiner*—Daniel Zirker
*Attorney, Agent, or Firm*—Raymond L. Owens

[57] ABSTRACT

A magnetooptic medium comprising a substrate, an amorphous seed layer and a recording multilayer deposited onto the seed layer wherein the seed layer has a thickness of greater than 18 nm but less than 200 nm and is selected to improve the coercivity, squareness, and Kerr rotation of the Kerr hysteresis loop of the recording multilayer, and the recording multilayer includes alternating layers of cobalt and platinum or cobalt and palladium or cobalt and platinum-palladium alloy.

5 Claims, 11 Drawing Sheets

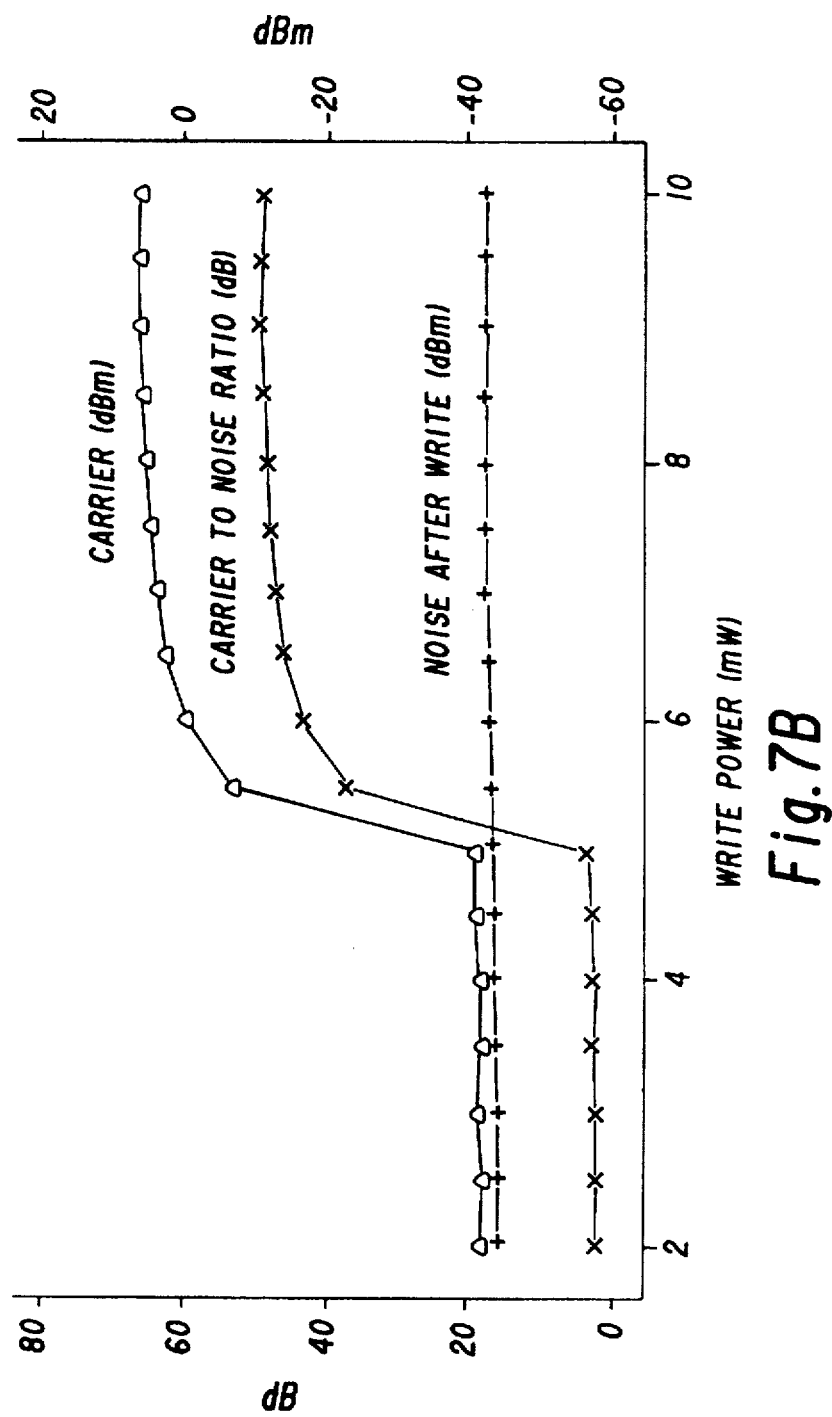

MULTILAYER MAGNETOOPTIC RECORDING MEDIA

CROSS REFERENCE TO RELATED APPLICATION

Reference is made to commonly assigned U.S. patent application Ser. No. 08/076,604, now U.S. Pat. No. 5,565,266 filed Jun. 14, 1993 to Tukaram K. Hatwar et al, entitled "Multilayer Magnetooptic Recording Media," the teachings of which are incorporated herein.

FIELD OF THE INVENTION

This invention relates to magnetooptical (MO) recording media having a cobalt/platinum (Co/Pt) or cobalt/palladium (Co/Pd) multilayered structure.

BACKGROUND OF THE INVENTION

Co/Pt multilayers have been used for MO recording media. These materials have perpendicular magnetic anisotropy, large Kerr rotation at short wavelength and excellent environmental stability. However, these materials when deposited by conventional sputtering processes possess low coercivity. Attempts have been made to increase the coercivity by controlling the Co/Pt ratio, using seed layers of metals and dielectrics, and etching the substrate before depositing the multilayer (see Magnetooptic Recording Medium, European Patent Appln. 0304873 (1988)); Perpendicular Magnetic Recording Media, European Patent Application 0304927 (1989); U.S. Pat. No. 5,082,749; and "Dielectric Enhancement Layers for a Co/Pt Multilayer Magnetooptic Recording Medium", Carcia et al, Appl. Phys Lett. 58 (1991), pages 191–193. For through substrate recording, the use of a metal seed layer is objectionable since it attenuates the Kerr rotation, decreases the figure of merit and decreases the recording sensitivity.

Carcia et al, supra, reported improvement in coercivity in Co/Pt multilayers using layers of crystalline $In_2O_3$ and ZnO. To achieve desired squareness, noise level and carrier to noise ratio, Carcia et al used an additional step of sputter etching the dielectric surface. Etching adds to the production costs. Carcia et al emphasized the use of crystalline underlayers in combination with Co/Pt multilayers which are also crystalline. Carcia et al also reported that some of the most commonly used dielectric materials such as $Si_3N_4$, $TiO_2$, $Nb_2O_5$ and ZnS, were ineffective in changing the coercivity.

It has been noted in the Carcia et al reference, that the 100 nm thick seed layer of $In_2O_3$ with 4% Sn enhanced the coercivity of the Co/Pt multilayer. However, no particulars were discussed with respect to the seed layer. This material prepared by Carcia et al is crystalline as per the reference RCA Review, Vol. 32, pg. 7 and U.S. Pat. No. 5,192,626.

It is believed that high crystallinity of the seed layer was required to improve the texture and growth of Co/Pt multilayer structure. However, high crystallinity give rise to noise during recording process.

SUMMARY OF THE INVENTION

It is therefore an object of the present invention to provide an improved magneto optic media structure having a Co/Pt multilayer but with increased coercivity, squareness, Kerr rotation, and lower recording noise.

Quite unexpectedly, it has been found that an amorphous seed layer (non-crystalline) that has a thickness greater than 18 nm and less than 200 nm solves the above noted problems.

This object is achieved by a magnetooptic medium comprising a substrate, an amorphous seed layer of indium-tin-oxide (ITO) and a recording multilayer deposited onto the seed layer wherein the seed layer has a thickness of greater than 18 nm but less than 200 nm and is selected to improve the coercivity, squareness, and Kerr rotation of the Kerr hysteresis loop of the recording multilayer, and the recording multilayer includes alternating layers of cobalt and platinum or cobalt and palladium or cobalt and platinum-palladium alloy.

ADVANTAGES

The following are advantages of magnetooptic media made in accordance with this invention:

a) these amorphous seed layers significantly enhance the coercivity and squareness of the Kerr hysteresis loop;

b) these amorphous seed layers reduce the writing noise, increase the carrier and hence the general performance of the MO structure; and (c) the present invention provides a structure with not only improved squareness and coercivity, but also improved Kerr rotation and writing sensitivity.

BRIEF DESCRIPTION OF THE DRAWINGS

FIGS. 7a and 7b are plots which respectively show carrier, noise, and carrier to noise ratios as a function of the write power for different MO media structures made in accordance with the invention;

DETAILED DESCRIPTION OF THE INVENTION

Figure 1:
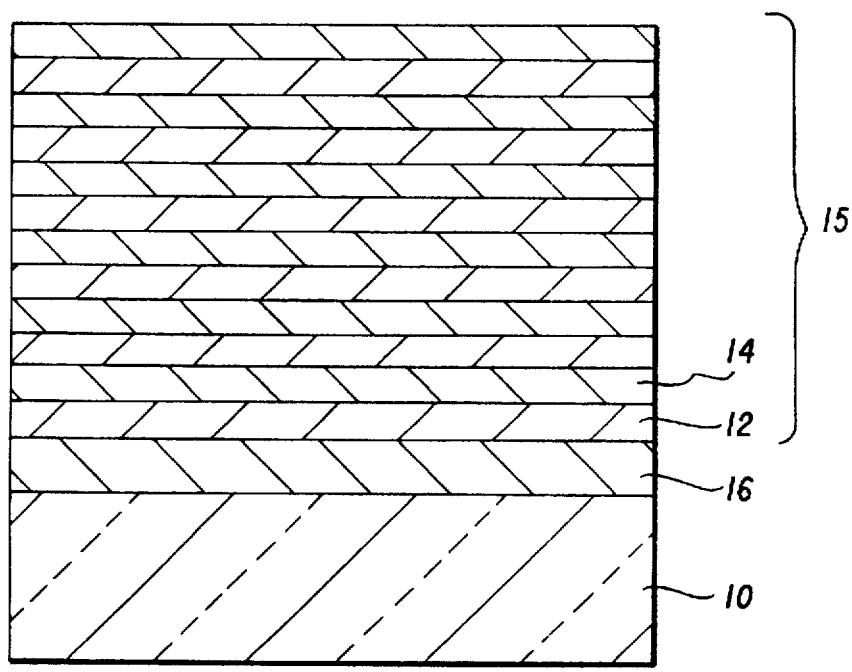
FIG. 1 shows a magnetooptic recording structure made in accordance with the invention.

Whenever the term amorphous is used it means a disordered structure in which present detection means such as x-ray diffraction cannot detect substantially any crystallinity. Turning first to FIG. 1, a schematic shows a magnetooptic structure made in accordance with the invention. The prior art structure by S. Sumi et al, ((Abstract Mq-3, "Magnetooptic Recording International Symposium". (MORIS). December, 1992, Tuscon, Ariz.)) and Garcia et al. supra, use crystalline ZnO. This drawing shows that magnetooptic structures made in accordance with the present invention uses amorphous ITO as a seed layer instead of a crystalline material.

Turning now to FIG. 1 the device includes a substrate 10 which is made of polycarbonate and a thick first seed layer 16 made of ITO. On the ITO seed layer 16 there is provided a multilayer recording element 15 having alternating bilayers of Pt layer 12 and Co layer 14. Substrate 10 can be made of glass or polycarbonate. Generally the substrate is transparent as light from a laser or other source will illuminate a recording multilayer structure as described through the substrate. On the substrate are provided a multilayer structure 15 formed of alternating layers of Pt layer 12 and Co layer 14. The Pt layers typically having a range of from 0.4–2 nm and the Co layers have a thickness of 0.2–0.8 nm. Between the substrate and the multilayer recording element is the seed layer 16. We found that seed layer thicknesses between 18 nm–200 nm are adequate to maintain desired reflectance of the Co/Pt multilayer. These structures are particularly suitable for use in magnetooptic disks, compact disks (CD), and photo compact disks (Photo CD).

With this type of structure, incident laser light illuminates a particular portion of the substrate, passes through the substrate, and interacts with the multilayered structure changing the Kerr rotation. As is well known, during readout, the Kerr rotation can be monitored to indicate whether a bit has been recorded.

Figure 2:
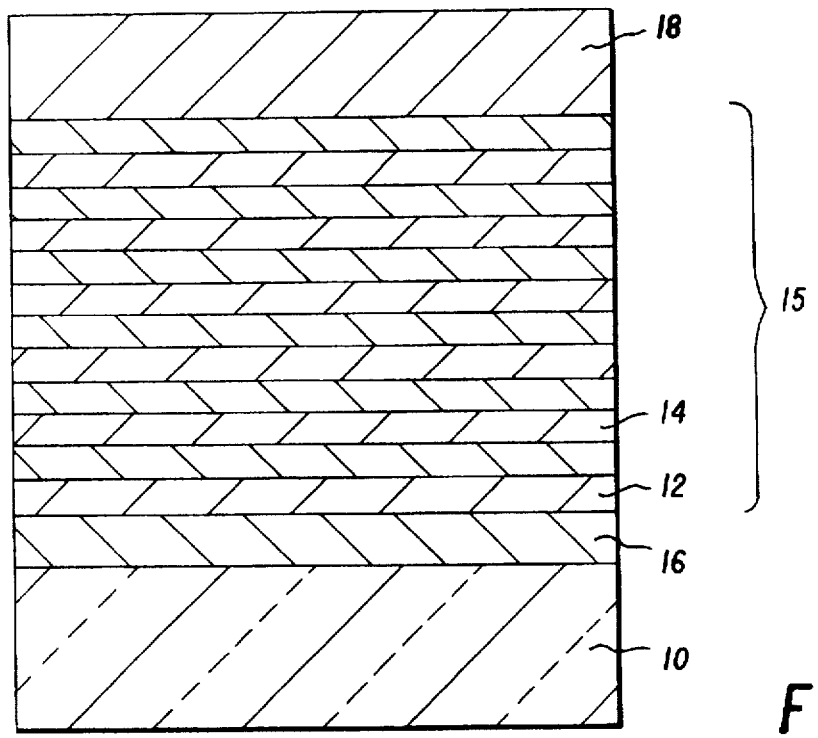
FIG. 2 shows an expanded version of a magnetooptic recording structure similar to FIG. 1 but with an overcoat protective layer.

Turning now to FIG. 2, which is a structure similar to FIG. 1, with the exception that there is an overcoat layer 18 of UV-curable organic lacquer. The overcoat layer 18 is scratch resistant and maintains structural integrity of the media. Also, a dielectric layer can be provided directly on the Co/Pt multilayer. This layer may be selected to be the same material as the seed layer or some other material. Its function is to thermally insulate the lacquer layer from the recording multilayer. It also can be selected to provide an optical enahancement function if the media is illuminated by light passing through it (front surface recording).

The seed layer 16, in accordance with the invention, is formed from ITO. ITO is a compound formed of indium oxide ($In_2O_3$) and tin oxide ($SnO_2$). This seed layer is amorphous in structure and provides a number of advantages. The thickness of the seed layer preferably is greater than 18 nm but should be less than 200 nm.

MAKING MO STRUCTURES

Thin structures of $In_2O_3$ and indium-tin oxide (ITO) were prepared by d.c. sputtering a homogenous target in Ar (or Kr) and Ar+1%$O_2$ (or Kr+1%$O_2$) atmosphere. Targets of varying amounts of $In_2O_3$ and $SnO_2$ prepared by hot-press method were used to obtain structures of various ITO compositions. Structures were deposited on glass and Si substrates. These structures were optically transparent in the 300–900 nm wavelength region, and had a high index of refraction and low extinction coefficient. The refractive index, n, increased monotonically from 2.26 at 820 nm to 2.44 at 420 nm, while the absorption coefficient, k was smaller than 0.05.

Figure 3:
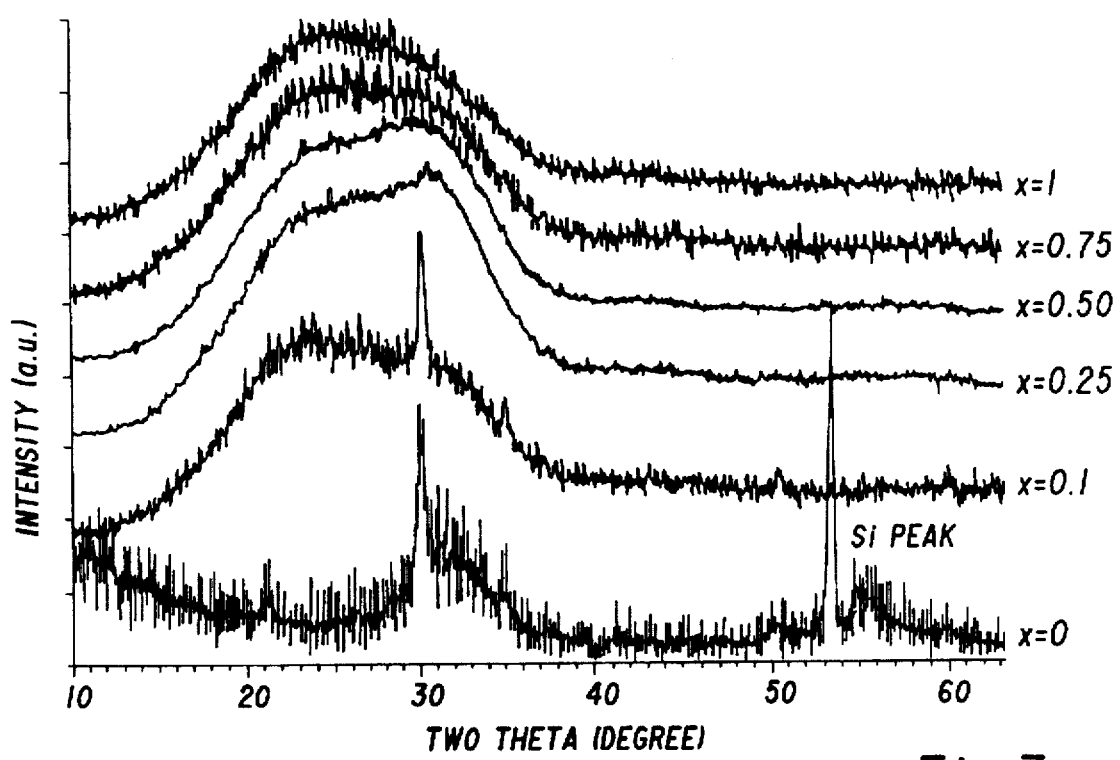
FIG. 3 is an x-ray diffraction pattern of intensity versus angle two Theta for various compositions of ITO.

Turning now to FIG. 3, the crystallinity of $(In_2O_3)_{(1-x)}(SnO_2)_x$ (x=0, 0.1, 0.25, 0.5, 0.75 and 1.0) structures was analyzed by x-ray diffraction and found to vary with the ITO composition. As seen in FIG. 3, a strong peak around $2\theta=30°$ was observed for x=0, corresponding to the body centered cubic (bcc) structure of $In_2O_3$ indicating that $In_2O_3$ is highly crystalline. Whereas such features are absent for x=1, corresponding to $SnO_2$ film indicating that it is amorphous. With increasing amounts of $SnO_2$ (i.e., x component) the crystallinity of ITO decreases. ITO with 10–20% $SnO_2$ was crystalline, but less so than the $In_2O_3$ film. With increasing $SnO_2$ content, the film became less crystalline (amorphous-like). Finally, ITO films greater than 50% $SnO_2$ were completely amorphous, similar to $SnO_2$.

The Co/Pt multilayers were prepared by d.c. sputtering Co and Pt targets in Ar or Kr atmosphere. The base pressure before depositing the structures was about $1\times10^{-5}$ to $1\times10^{-6}$ Torr and deposition pressure was about 20–100 mT. Alternate layers of Co and Pt were deposited onto a substrate spinning over the Co and Pt targets. The thickness of each layer was controlled by controlling the deposition rate and the substrate rotation speed. The thickness of Co and Pt were 0.2–0.8 nm and 0.4–1.8 nm, respectively, and the number of bilayers was 3–23. A pair of adjacent layers of Pt and Co is often referred to in the art as a bilayer.

Several test samples were prepared by depositing the Co/Pt multilayers without and with seed layers on small test samples of glass and polycarbonate (PC) substrates. Structures were also deposited on the 5.25 dia. glass and PC substrates. Structures that were made are shown in FIGS. 1 and 2.

The perpendicular Kerr hysteresis loops were measured at 780 nm wavelength to obtain coercivity (Hc) and the Kerr rotation ($\theta k$) of the structures. The dynamic measurements of the MO structures were made under the following conditions: 5.6–7 m/sec disk velocity, 1 MHz carrier frequency, 33–50% duty cycle, 30 kHz bandwidth, 300 Oe bias field, 0–10 mW write power and 1.5–2.0 mw read power.

EXAMPLES

Figure 4A:
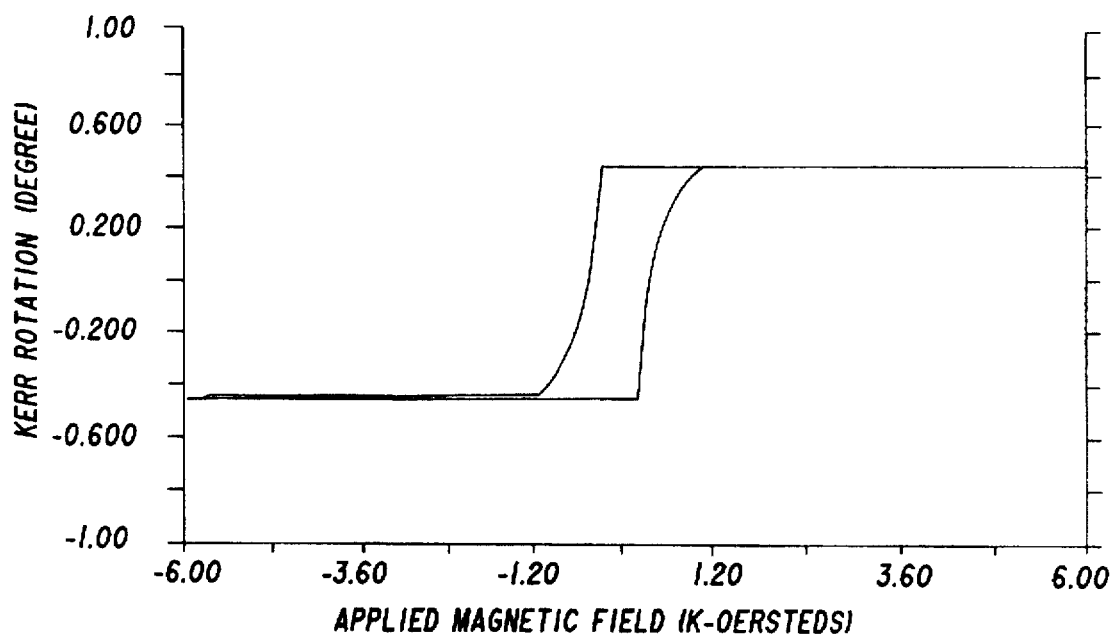
FIG. 4a shows a Kerr hysteresis loop plot without using a seed layer.

A Co/Pt multilayer structure with twelve bilayers was sputter deposited on a 5.25" dia. glass substrate using 20 mT Kr sputtering pressure. The thickness of the individual Co and Pt lyers were 0.25 nm and 0.8 nm, respectively. The Kerr loop for this structure is shown in FIG. 4a. Coercivity and the Kerr rotation were 421 Oe and 0.45 degree, respectively.

Figure 4B:
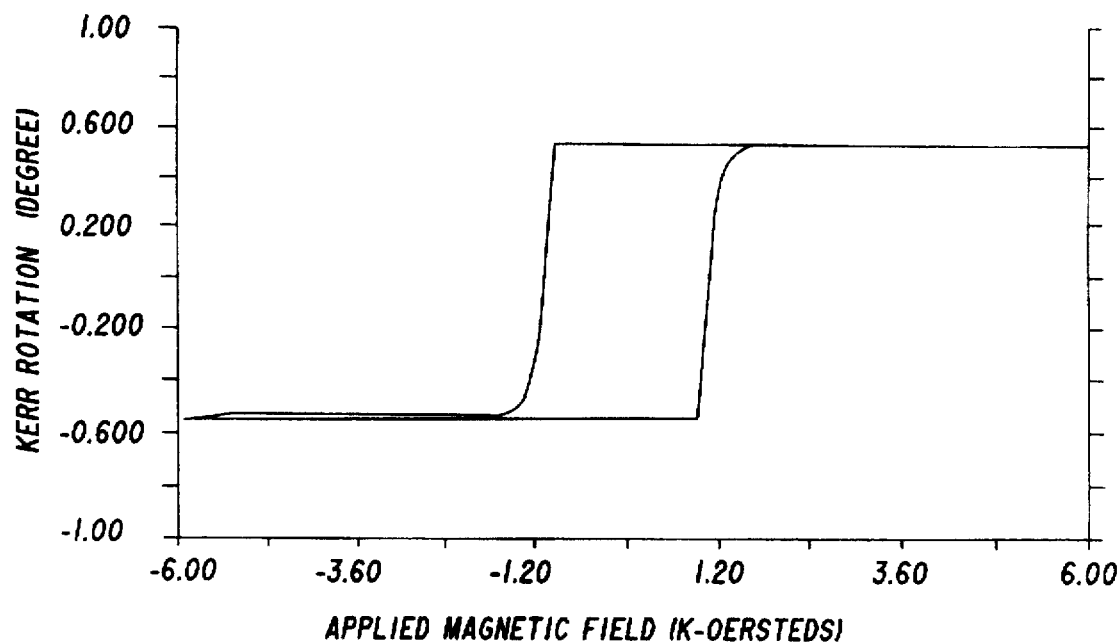
FIG. 4b shows a plot similar to FIG. 4a but with an ITO seed layer of 20 nm thickness.

Another sample was prepared under the same conditions first by sputter depositing a 20 nm amorphous seed layer of $(In_2O_3)_{50}(SnO_2)_{50}$ using 3 mT Ar sputtering pressure and then the twelve bilayers of the same composition Co/Pt multilayer structure. The Kerr loop of this structure is shown in FIG. 4b. Surprisingly, the Co/Pt multilayer structure deposited on ITO seed layer has substantially larger coercivity (Hc=1080 Oe and $\theta k$=0.48 degree) than that sputtered directly on the substrate. Also the squareness of the Kerr loop is tremendously improved. We will later show that this improvement in the squareness of the Kerr loop reduces the writing noise during recording and improves the general performance of the disk.

Figure 4C:
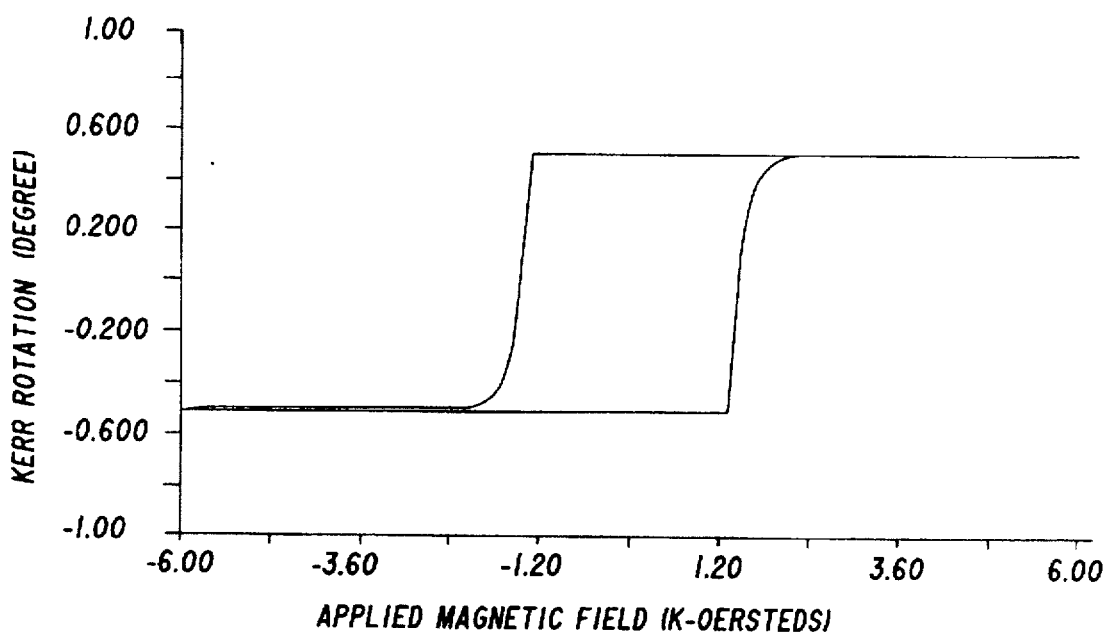
FIG. 4c shows a plot similar to FIG. 4a but with an ITO seed layer of 30 nm thickness.
Figure 4D:
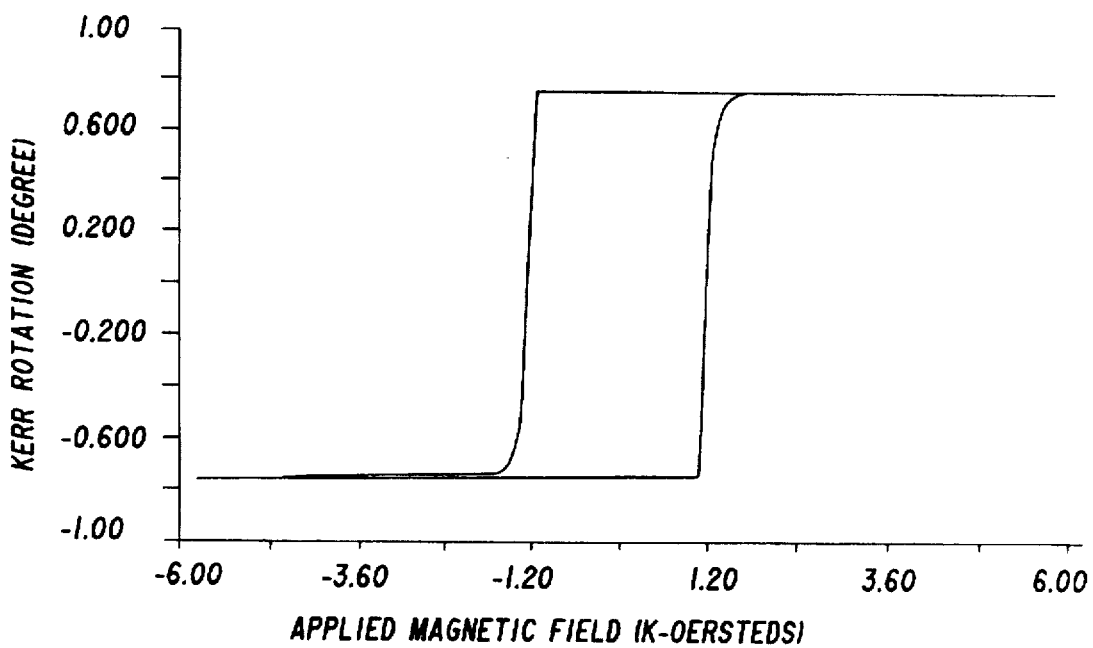
FIG. 4d shows a plot similar to FIG. 4a but with an ITO seed layer of 40 nm thickness.
Figure 4E:
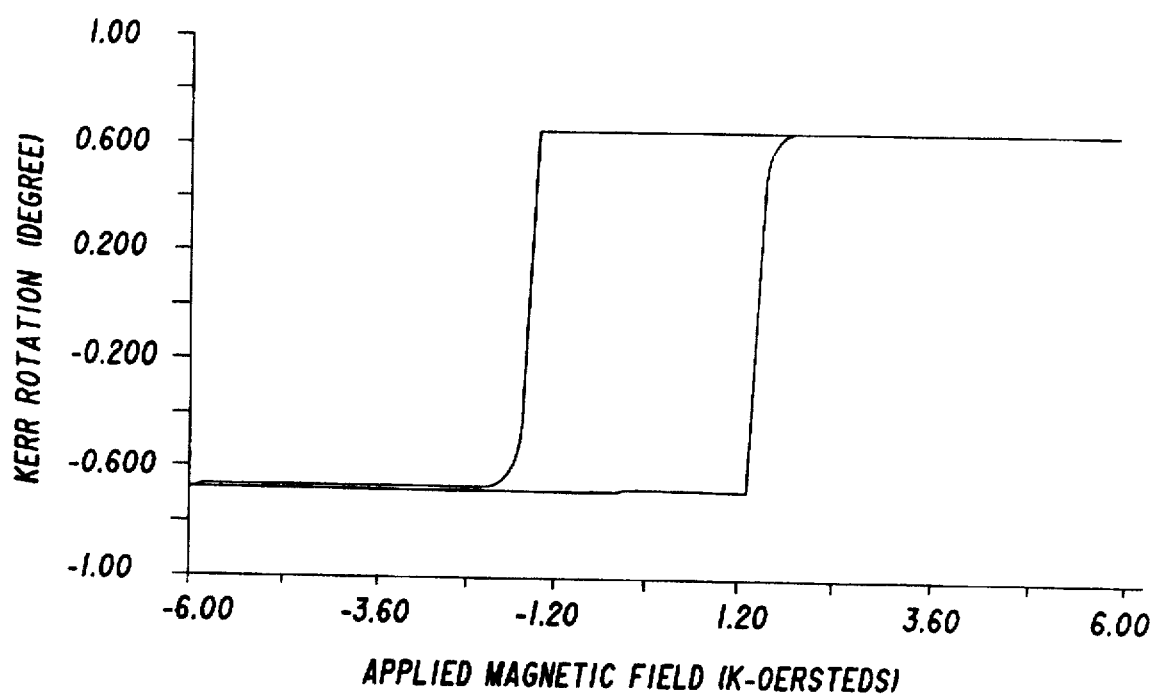
FIG. 4e shows a plot similar to FIG. 4a but with an ITO seed layer of 100 nm thickness.

The Kerr loops of the Co/Pt multilayer structures deposited on varying thicknesses of the $(In_2O_3)_{50}(SnO_2)_{50}$ seed layers were measured. In FIGS. 4c, 4d, and 4e are shown the Kerr loops of the Co/Pt multilayers with ITO thickness of 30 nm, 40 nm, and 100 nm, respectively. As the thickness of the ITO increased from 30 nm to 40 nm to 100 nm, the coercivity and squareness remained about the same, while the Kerr rotation (also the reflectivity) changed.

It is important to note that the seed layers should be amorphous to obtain a significant enhancement not only in the coercivity but in the squareness of the Kerr loop of the Co/Pt multilayer. Thick crystalline seed layers may achieve coercivity enhancement but do not achieve good squareness. For example, 100 nm thick $In_2O_3$, which is crystalline when prepared in Ar or Ar+1%$O_2$ atmosphere as seen by x-ray diffraction patterns, shows a significant enhancement in the coercivity of the Co/Pt multilayer, but the recording noise level is very high.

X-ray diffraction patterns for the Co/Pt structure without a seed layer and with a ITO seed layer deposited on glass substrate were obtained. The intensity of the main Co/Pt (111) peak was much higher than that without any seed layer. These results indicate that an ITO seed layer improves the ordering of the multilayer structures. Similar results were obtained from the low angle x-ray diffraction patterns and indicated that the flatness of the structure surface and layer interfaces are improved with a seed layer. Atomic force microscopy (AFM) study showed very smooth surfaces for both the structures, but the surface roughness was higher for the structure without a seed layer.

Figure 5:
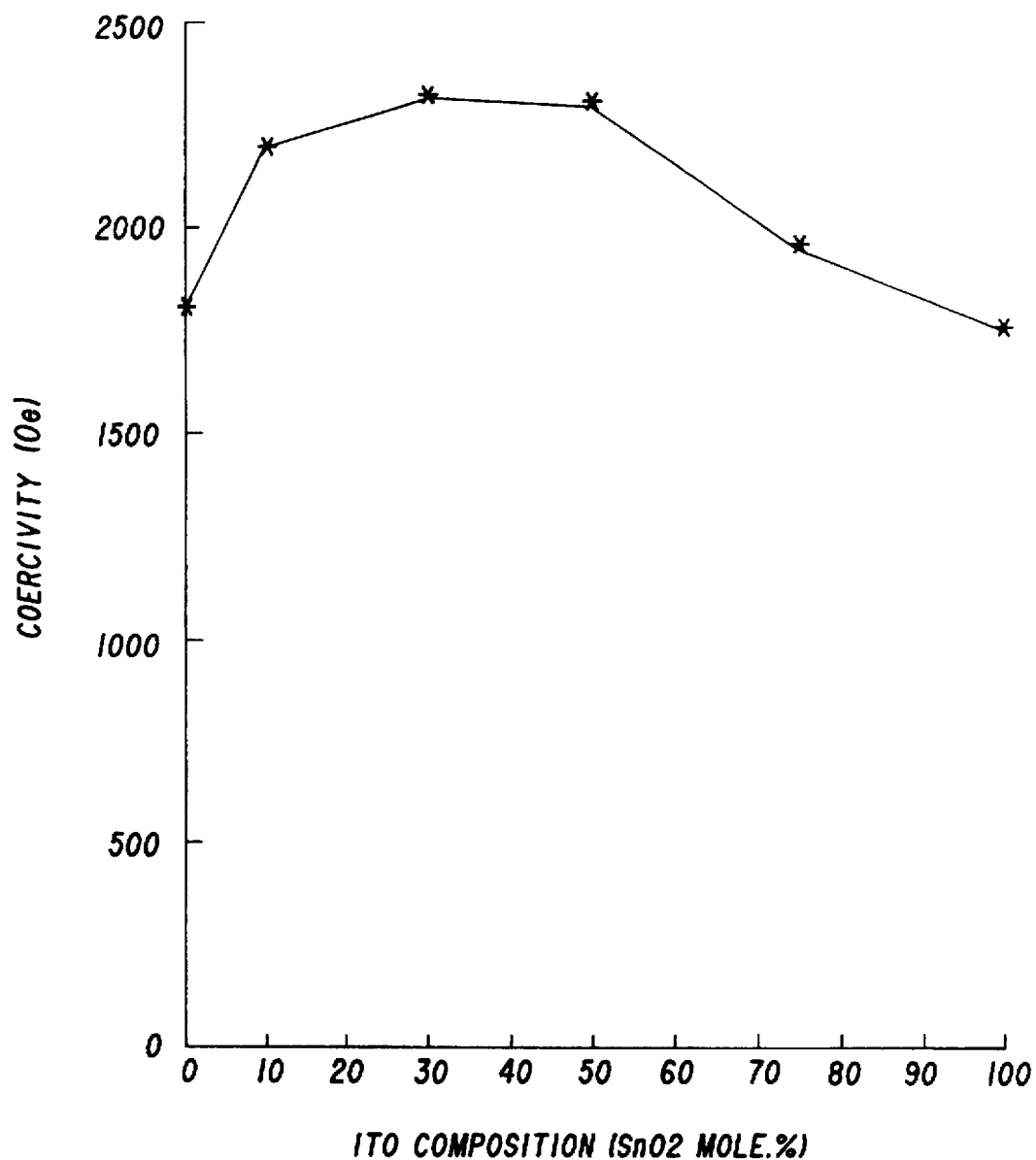
FIG. 5 is a plot of coercivity of Co/Pt multilayer film using ITO seed layers of various compositions.

The enhancement in the coercivity of the Co/Pt film depends on the deposition conditions of the ITO underlayer. The coercivity was increased monotomically with increasing pressure. Also, it depends on the ITO composition of the underlayer. For the purpose of comparison, all ITO compositions were sputter deposited at 5 mT Ar+1% $O_2$ pressure. Twelve bilayers of Co 0.4 nm/Pt 0.8 nm were deposited on an ITO seed layer of 100 nm thick on the glass substrate. FIG. 5 shows the coercivity of the Co/Pt multilayer as a function of ITO composition. Coercivity greater than 2400 Oersted (Oe) were obtained for the multilayer with ITO composition containing 10 to 50% $SnO_2$.

Figure 6:
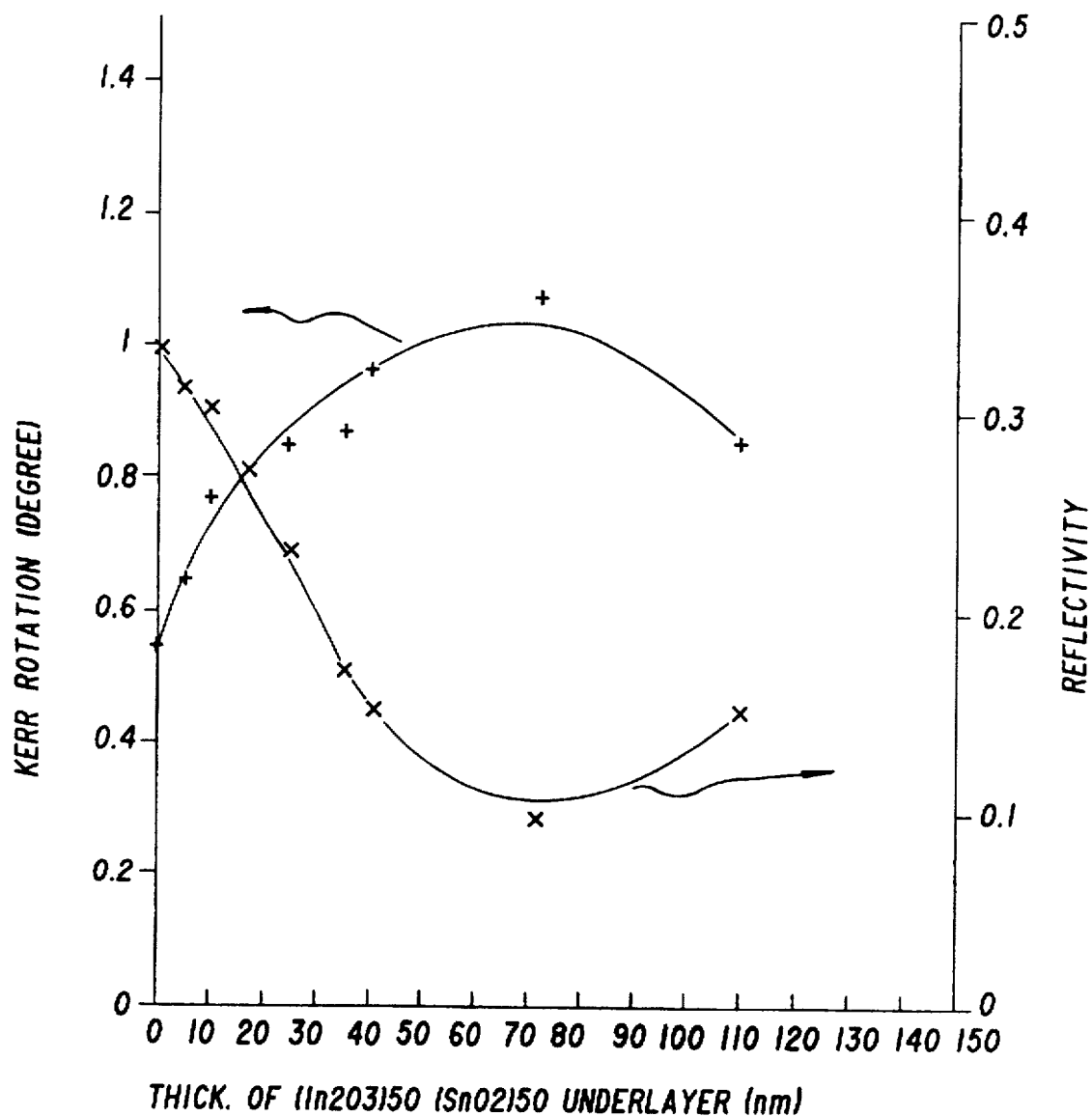
FIG. 6 is a plot showing Kerr rotation versus thickness for a $(In_2O_3)_{50}(SnO_2)_{50}$ seed layer.

FIG. 6 shows the Kerr rotation and reflectivity of the Co/Pt multilayer disk with varying thickness of ITO seed layer. In this case, first $(In_2O_3)_{50}(SnO_2)_{50}$ seed layer was deposited on the glass substrate, followed by 12 bilayers of Co 0.25 nm/Pt 0.8 nm multilayer. It shows that Kerr rotation increases with increasing ITO thickness and reaches a maximum at about 70 nm, and then starts decreasing. The opposite behavior is shown by the reflectivity. Thus, both the Kerr rotation and the reflectivity of the multilayer disk can be optimized by properly selecting the thickness of the ITO seed layer.

At this time the mechanism of improvement in the magnetic properties of Co/Pt multilayer due to amorphous seed layers is not completely understood. However, we believe that this mechanism is different than that observed for crystalline seed layers. Seed layers of amorphous materials may reduce the substrate surface energy and orient the subsequently deposited Co/Pt multilayer in a preferred direction, thus enhancing the magnetic anisotropy and the coercivity of the Co/Pt multilayer. On the other hand, crystalline seed layers are highly oriented structures. For example, ZnO thick structure which was used as a seed layer in European Patent Application 0304927 (1989), supra, has c-axis oriented normal to structure plane. These highly textured or oriented seed layers are thought to improve the texture and growth of Co/Pt multilayer. In the Carcia et al, supra, it was shown that better the crystalline nature of seed layer, the higher the coercivity of Co/Pt multilayer.

Figure 7A:
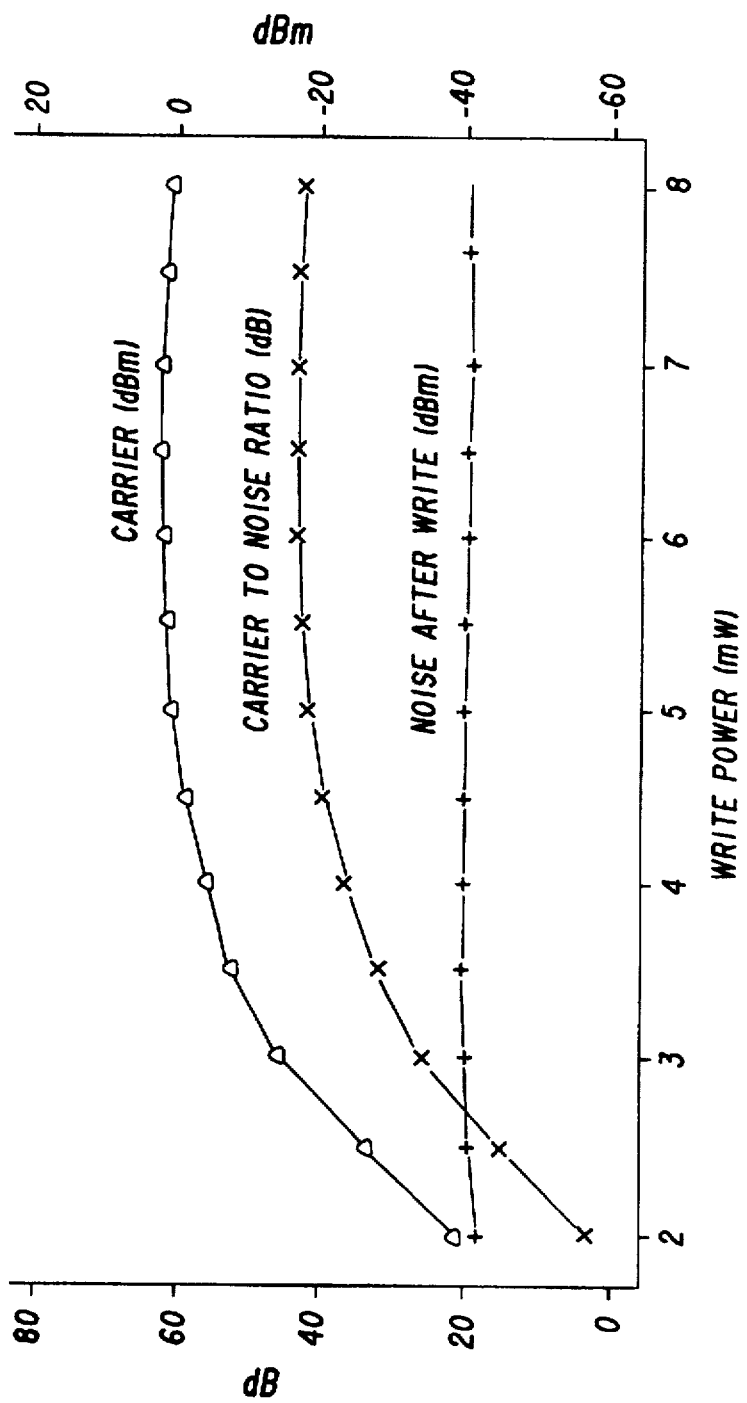

Several full structure disks were prepared by depositing Co/Pt multilayer with or without seed layers on 5.25" dia. polycarbonate and glass substrates. These disks were tested for dynamic performance. FIGS. 7a and 7b show the carrier (C), noise (N), and carrier to noise ratio (at 0.7 mm mark length, 5.6 m/s disk velocity, 300 oe bias field, 1.5 mw read power, 1 MHz carrier frequency and 30 kHz bandwidth) as a function of write power obtained for two Co/Pt multilayer disks without a seed layer and with a 80 nm $(In_2O_3)_{50}(SnO_2)_{50}$ seed layer deposited on polycarbonate (PC) substrates. The comparison reveals that significantly lower noise and a higher CNR is obtained in the MO structure with an amorphous ITO seed layer.

All the disks using various ITO compositions exhibited similar carrier levels as well as Kerr rotation, but they obviously were different in the noise level and the writing sensitivity. The disks with crystalline underlayer were very noisy, whereas the disks with amorphous seed layers showed very low noise. The lower noise in the case of an amorphous seed layer is attributed to their finer microstructure and smooth surface.

Figure 8:
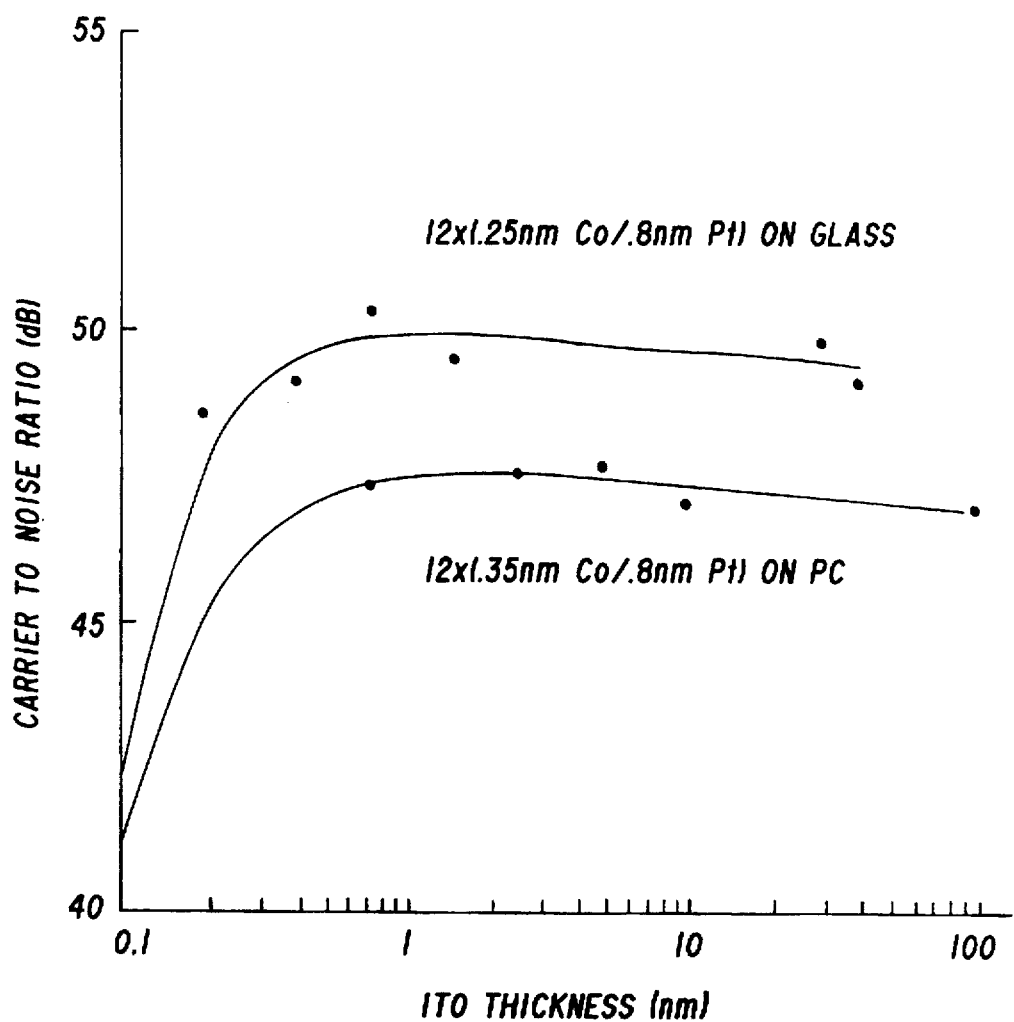
FIG. 8 is a plot showing the carrier to noise ratios for various Co/Pt ratios as a function of ITO seed layer thickness.

FIG. 8 shows the CNR as a function of ITO seed layer thickness for various compositions of 12 bilayers of cobalt and platinum. Significant improvement in the carrier to noise ratio (CNR) of the Co/Pt multilayer disk is obtained with ITO seed layer. It should be noted that noise level in disks using amorphous seed layers of ITO were consistently lower by 1–2 dB than those using a crystalline seed layer.

Figure 9:
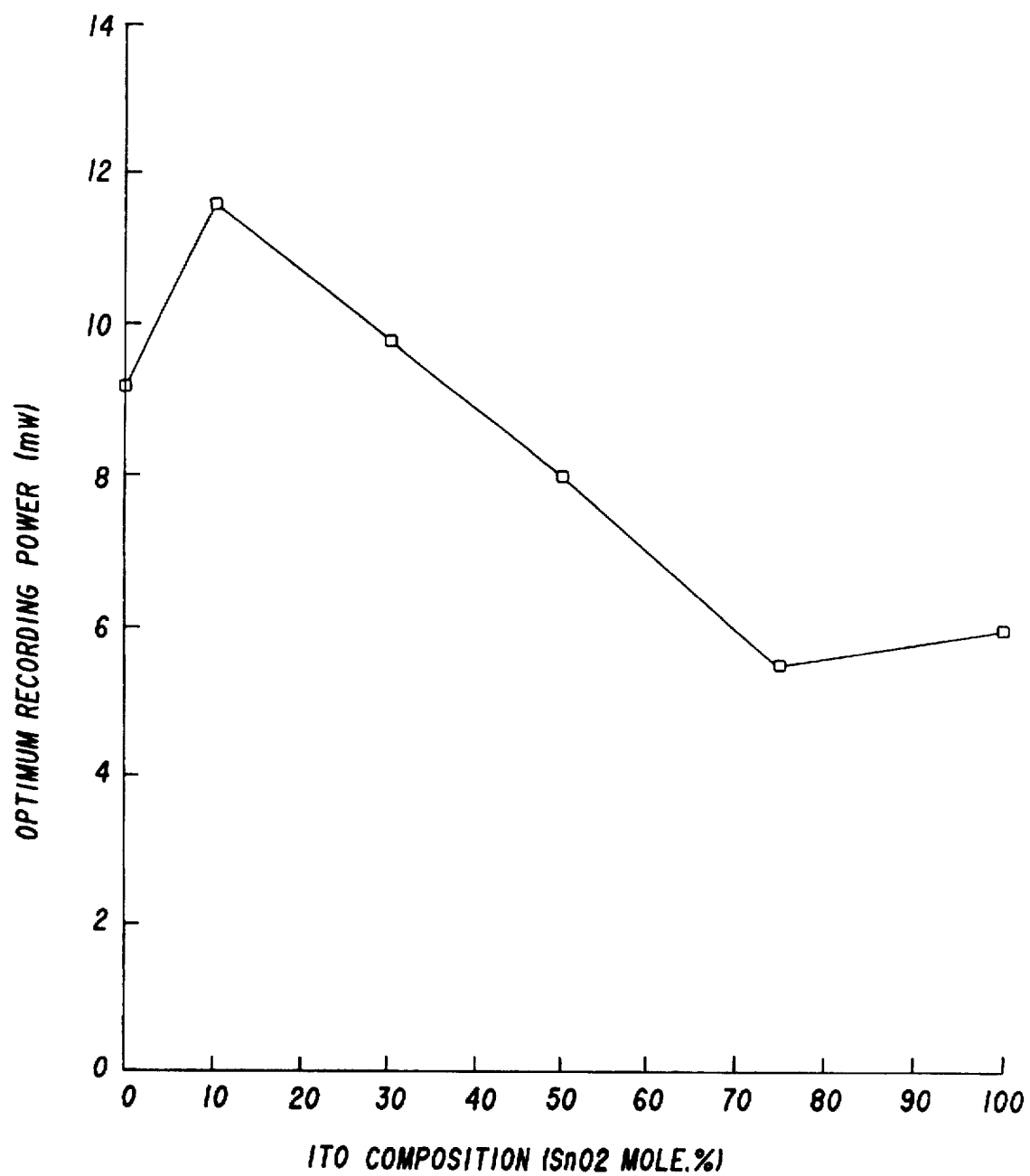
FIG. 9 is a plot of optimum recording power using ITO seed layers of different compositions.

Significant differences are observed in the writing sensitivity of the disk with various ITO compositions. FIG. 9 shows the optimum recording power (ORP) for the disk as a function of ITO seed layer composition. The thickness of the seed layer is about 80 nm in all the disks. The sensitivity of the disk is much higher for the underlayer having high $SnO_2$ content. The disks with $(In_2O_3)_{25}(SnO_2)_{75}$ seed layer had the lowest ORP and the highest maximum sensitivity. In fact, a two fold increase in recording sensitivity was observed as $SnO_2$ content is increased from 0 to 75%. This behavior was correlated to the composition induced changes in the microstructure and thermal conductivity of the ITO underlayer. ITO underlayer acts as a thermal barrier between the substrate and the Co/Pt recording multilayer. The reduction in crystallinity with increasing $SnO_2$ content decreases the ITO thermal conductivity, thus increasing its effectiveness as a thermal barrier, which results in the increase in recording sensitivity.

The MO structure was prepared in accordance with FIG. 2 which includes a UV cured lacquer overlayer 18. An example of such a lacquer is "Daicure Clear SD-17", a UV curable acrylic resin available from Dainippon Ink and Chemicals, Inc. The lacquer is typically applied by a spin coating technique and cured in the presence of UV light. This arrangement improves stability of the Co/Pt multilayer media. We found that even though Co/Pt multilayers have good chemical (corrosion and oxidation resistance) and thermal stability, they do not have good mechanical durability. We also observed the degradation of carrier level and increase in the bit error rate (BER) by repetitive write/erase process. This was ascribed to the deformation or delamination of the multilayer structure from the substrate surface. For putting Co/Pt multilayer media into a practical applications, we improved mechanical durability of these structures by overcoating the MO structure with a protective layer of UV-cured organic lacquer layer about 5–30 μm thick by spin coating method.

The invention has been described in detail with particular reference to certain preferred embodiments thereof, but it will be understood that variations and modifications can be effected within the spirit and scope of the invention.

PARTS LIST 10 substrate
12 Pt layer
14 Co layer 15 multilayer recording element
16 seed layer
18 overcoat

We claim:

1. A magnetooptic medium comprising a substrate, an amorphous seed layer composed of $(In_2O_3)_{1-x}(SnO_2)_x$ where x=0.21 to 0.90 and a recording multilayer deposited onto the seed layer wherein the seed layer has a thickness of greater than 20 nm but less than 200 nm and is selected to improve the recording sensitivity coercivity, squareness, and Kerr rotation of the Kerr hysteresis loop of the recording multilayer, and the recording multilayer includes alternating layers of cobalt and platinum or cobalt and palladium or cobalt and platinum-palladium alloy.

2. The magnetooptic recording medium of claim 1 wherein a layer of dielectric material is deposited on the recording multilayer.

3. The magnetooptic medium of claim 1 further including a UV curable lacquer overcoat provided over the multilayer.

4. The magnetooptic medium of claim 2 further including a UV curable lacquer overcoat on the dielectric layer.

5. The magnetooptic recording medium of claim 1 wherein said multilayer film contains 1–25 bilayers of Co and Pt, the Co and Pt thickness varies between 0.2 to 0.8 nm and 0.4 to 1.8 nm, respectively.

* * * * *